United States Patent
Yamamoto

(10) Patent No.: US 8,580,406 B2
(45) Date of Patent: Nov. 12, 2013

(54) HARD COATING FILM, MATERIAL COATED WITH HARD COATING FILM AND DIE FOR COLD PLASTIC WORKING AND METHOD FOR FORMING HARD COATING FILM

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 344 days.

(21) Appl. No.: 12/671,123

(22) PCT Filed: Jul. 10, 2008

(86) PCT No.: PCT/JP2008/062512
§ 371 (c)(1),
(2), (4) Date: Jan. 28, 2010

(87) PCT Pub. No.: WO2009/016938
PCT Pub. Date: Feb. 5, 2009

(65) Prior Publication Data
US 2010/0189835 A1    Jul. 29, 2010

(30) Foreign Application Priority Data

Aug. 2, 2007 (JP) .................. 2007-202192
Jun. 2, 2008 (JP) .................. 2008-144723

(51) Int. Cl.
*B32B 9/00* (2006.01)

(52) U.S. Cl.
USPC ............ 428/697; 428/698; 428/699; 428/704

(58) Field of Classification Search
USPC .......... 204/192; 428/457, 469, 472, 697, 698, 428/699, 704
See application file for complete search history.

(56) References Cited

U.S. PATENT DOCUMENTS

| | | | |
|---|---|---|---|
| 4,202,705 A | 5/1980 | Komatsu et al. | |
| 4,525,417 A | 6/1985 | Dimigen et al. | |
| 6,110,571 A * | 8/2000 | Yaginuma et al. | 428/472 |
| 6,279,913 B1 * | 8/2001 | Iwashita et al. | 428/457 |
| 6,767,658 B2 * | 7/2004 | Yamamoto et al. | 428/697 |
| 6,811,899 B2 * | 11/2004 | Inoue | 428/698 |
| 7,056,602 B2 * | 6/2006 | Horling et al. | 428/699 |
| 7,067,203 B2 * | 6/2006 | Joelsson et al. | 428/699 |
| 7,083,868 B2 * | 8/2006 | Horling et al. | 428/698 |
| 7,811,683 B2 * | 10/2010 | Zhu et al. | 428/697 |
| 7,910,210 B2 * | 3/2011 | Kreupl et al. | 428/698 |
| 2003/0059632 A1 | 3/2003 | Inoue | |
| 2003/0148145 A1 | 8/2003 | Yamamoto et al. | |
| 2007/0178330 A1 * | 8/2007 | Sjolen et al. | 428/697 |
| 2010/0086756 A1 * | 4/2010 | Miya et al. | 428/698 |

FOREIGN PATENT DOCUMENTS

| | | |
|---|---|---|
| DE | 102 42 421 A1 | 3/2004 |
| DE | 10 2005 056 262 A1 | 5/2007 |
| EP | 2 070 695 A1 | 6/2009 |
| GB | 2 343 496 A | 5/2000 |
| JP | 58 181775 | 10/1983 |
| JP | 3 197663 | 8/1991 |
| JP | 5 239620 | 9/1993 |
| JP | 6 322517 | 11/1994 |
| JP | 7 173608 | 7/1995 |
| JP | 10 330914 | 12/1998 |
| JP | 11 302831 | 11/1999 |
| JP | 2000 1768 | 1/2000 |
| JP | 2000 144376 | 5/2000 |
| JP | 2002 307128 | 10/2002 |
| JP | 2002 307129 | 10/2002 |
| JP | 2003 34859 | 2/2003 |
| JP | 2005-111574 * | 4/2005 |
| JP | 2005-199420 * | 7/2005 |
| JP | 2006 124818 | 5/2006 |
| JP | 2007 119795 | 5/2007 |
| JP | 2007-291471 * | 11/2007 |

OTHER PUBLICATIONS

Office Action issued Apr. 8, 2011 in German Patent Application No. 11 2008 001 882.0-45 (with English translation).

\* cited by examiner

*Primary Examiner* — Archene Turner
(74) *Attorney, Agent, or Firm* — Oblon, Spivak, McClelland, Maier & Neustadt, L.L.P.

(57) ABSTRACT

The present invention provides hard coating film which excels conventional surface coating layer in wear resistance, has lower frictional coefficient and better slidability, a material coated with the hard coating film, a die for cold plastic working, and a method for forming the hard coating film. The hard coating film according to the present invention is a hard coating film comprising $(Nb_xM_{1-x})_y(B_aC_bN_{1-a-b})_{1-y}$, where

| | |
|---|---|
| $0.2 \le x \le 1.0$ | Equation (1) |
| $0 \le a \le 0.3$ | Equation (2) |
| $0 \le 1-a-b \le 0.5$ | Equation (3) |
| $0.5 \le b \le 1$ | Equation (4) |
| $0.4 \le 1-y \le 0.9$ | Equation (5) |

[however, M denotes at least one species of elements belonging to Groups 4a, 5a, and 6a and Si and Al; x, 1-x, a, b, and 1-a-b represent respectively the atomic ratio of Nb, M, B, C and N; and y and 1-y represent respectively the ratio of $(Nb_xM_{1-x})$ and $(B_aC_bN_{1-a-b})$].

2 Claims, No Drawings

HARD COATING FILM, MATERIAL COATED WITH HARD COATING FILM AND DIE FOR COLD PLASTIC WORKING AND METHOD FOR FORMING HARD COATING FILM

TECHNICAL FIELD

The present invention belongs to the technical field relating to hard coating film, material coated with hard coating film, die for cold plastic working and method for forming hard coating film. More particularly, the present invention belongs to the technical field relating to a hard coating film characterized by excellent wear resistance, low frictional coefficient and high slidability.

BACKGROUND ART

Nitriding has been a conventional way of improving the wear resistance and seize resistance of jigs and tools (such as dies) for metal working. Recently, attempts are being made to replace it with vapor phase coating such as PVD as a measure of improving wear resistance and seize resistance. For example, Japanese Patent Laid-open No. 2000-144376 discloses the improvement of slidability by formation of a complex nitride containing at least two species of Cr, Al, Ti, and V. Japanese Patent Laid-open Nos. 2002-307128 and 2002-307129 disclose a surface-coated die excelling in wear resistance and seize resistance which has a coating film of nitride, carbide, or carbonitride of at least one species of Ti, V, Al, Cr, and Si and an optional second coating film of sulfide of Ti, Cr, and Mo (as remainder). Japanese Patent Laid-open No. 2000-1768 discloses a surface-treated material excelling in wear resistance and seize resistance which is composed of hard nitride and $MoS_2$ formed thereon.

DISCLOSURE OF INVENTION

Problems to be Solved by the Invention

The complex nitride disclosed in Japanese Patent Laid-open No. 2000-144376, which contains at least two species of Cr, Al, Ti, and V, has high hardness and excels in wear resistance, but lacks high seize resistance and durability in use under severe conditions, such as plastic metal working at a high specific pressure. Likewise, the nitride, carbide, or carbonitride disclosed in Japanese Patent Laid-open No. 2002-307128, which contains at least one species of Ti, V, Al, Cr, and Si, has high hardness but lacks seize resistance. The sulfide formation disclosed in Japanese Patent Laid-open Nos. 2002-307129 and 2000-1768, which was developed to improve seize resistant, is poor in long-term durability because sulfide is soft (and hence initially has good slidability) and wears with time.

The present invention was completed in view of the foregoing. It is an object of the present invention to provide a hard coating film, a material coated with the hard coating film, a die for cold plastic working, and a method for forming a hard coating film, the coating film excelling the above-mentioned conventional surface coating layer in wear resistance as well as slidability with a low frictional coefficient.

Means for Solving the Problem

In order to achieve the above-mentioned object, the present inventors carried out a series of researches, which led to the present invention. The above-mentioned object is achieved by the present invention.

The present invention, which was completed to achieve the above-mentioned object, is concerned with hard coating film (according to first to fourth inventions), material coated with the hard coating film (according to fifth to sixth invention), die for cold plastic working (according to seventh invention), and method for forming hard coating film (according to eighth to ninth inventions). These inventions have the following constructions:

The hard coating film according to the present invention has a composition of $(Nb_xM_{1-x})_y(B_aC_bN_{1-a-b})_{1-y}$, where $$0.2 \le x \le 1.0 \qquad \text{Equation (1)}$$

$$0 \le a \le 0.3 \qquad \text{Equation (2)}$$

$$0 \le 1-a-b \le 0.5 \qquad \text{Equation (3)}$$

$$0.5 \le b \le 1 \qquad \text{Equation (4)}$$

$$0.4 \le 1-y \le 0.9 \qquad \text{Equation (5)}$$

M denotes at least one species of elements belonging to Groups 4a, 5a, and 6a and Si and Al; x, 1-x, a, b, and 1-a-b represent respectively the atomic ratio of Nb, M, B, C, and N; and y and 1-y represent respectively the ratio of $(Nb_xM_{1-x})$ and $(B_aC_bN_{1-a-b})$.

In the hard coating film, it is preferable that x is 1 [second invention].

In the hard coating film, it is preferable that y varies in the thickness direction of the film [third invention]. Alternatively, in a hard coating film having a multilayered structure in which two or more sheets of the hard coating films are laminated, it is preferable that y of the adjacent hard coating films are different from each other [fourth invention].

The material coated with hard coating film according to the present invention is characterized by one of the hard coating films of the first to fourth inventions formed on the surface of a substrate [fifth invention].

Alternatively, the material coated with hard coating film according to the present invention is characterized by a coating film layer comprising nitride of at least one species of elements belonging to Groups 4a, 5a, and 6a and Si and Al formed on the surface of the substrate consisting of ferrous alloy, and one of the hard coating films of the first to fourth inventions formed thereon [sixth invention].

The die for cold plastic working according to the present invention is characterized by using the material coated with hard coating film of the fifth or sixth invention [seventh invention].

The method for forming hard coating film according to the present invention is a method for forming hard coating film by forming one of the hard coating films of the first to fourth inventions using a cathode arc ion plating system in an atmosphere gas containing hydrocarbon gas, characterized by setting the partial pressure of hydrocarbon gas in the atmosphere gas to higher than 0.8 Pa but not higher than 4 Pa [eighth invention]. It is preferable that the hydrocarbon gas is at least one of methane gas, acetylene gas, and toluene gas [ninth invention].

Effect of the Invention

The hard coating film according to the present invention excels conventional surface coating layers in wear resistance and slidability with a low frictional coefficient. Therefore, it is suitably applied as a hard coating film to dies, jigs, and tools for their improvement in durability. The material coated with hard coating film according to the present invention excels in wear resistance and slidability with a low frictional coefficient, and it is suitable for use as dies, jigs, and tools with improved durability. The die for cold plastic working according to the present invention excels in wear resistance and slidability with a low frictional coefficient, and it exhibits good durability. The method for forming hard coating film according to the present invention can form the hard coating film according to the present invention with a smooth surface.

BEST MODE FOR CARRYING OUT THE INVENTION

The present inventors carried out a series of researches to achieve the above-mentioned object, which led to the finding that a coating film comprising a Nb carbide-based compound essentially consisting of Nb as a metallic element and essentially consisting of C as a non-metallic element excels in wear resistance and slidability with a low frictional coefficient, and has high sliding characteristics at a high specific pressure.

Herein, since NbC has very high hardness and is necessary to maintain wear resistance, the ratio (atomic ratio x) of Nb in metallic elements (Nb, M) is essentially 0.2 or higher, preferably 0.5 or higher, and more preferably 0.8 or higher. As for metallic elements (M) other than Nb, at least one species of elements belonging to Groups 4a, 5a, and 6a and Si and Al can be added as far as the wear resistance is not degraded. Since the Nb (CN) compounds do not have high resistance to oxidation (upper limit temperature in use: about 500° C.), elements such as Ti, Al, Cr and Si can be added thereto at a ratio of 0.8 or lower to improve resistance to oxidation at high temperatures. Moreover, in order to improve the sliding characteristics at a low temperature side, it is effective to add an element which forms an oxide having a low melting point such as V.

As for non-metallic elements (B, C, N), the compound which constitutes the above coating film is based on carbides basically having sliding characteristics. Therefore, the ratio of C (atomic ratio b) is essentially 0.5 or higher, preferably 0.7 or higher, and more preferably 0.8 or higher. BN compounds which have excellent slidability at a high temperature and compounds of metallic elements and nitrogen can be formed in the coating film by adding B and N, but addition of such elements in an excessive amount lowers the hardness of the coating film. Therefore, the ratio of B (atomic ratio a) is essentially 0.3 or lower; and preferably 0.1 or lower, and the ratio of N (atomic ratio: 1-a-b) is essentially 0.5 or lower; preferably 0.3 or lower; and more preferably 0.2 or lower.

The ratio of the non-metallic elements (B, C, N) to metallic elements [Nb, M (element at least one species selected from elements belonging to Groups 4a, 5a, and 6a and Si and Al)] is basically 1:1, which is close to stoichiometric composition. However, in case of a carbide, it was found that excellent sliding characteristics were exhibited when the ratio of non-metallic elements (1-y) is in the range of 0.4 to 0.9 (i.e., $0.4 \leq 1-y \leq 0.9$). It has been also found that when the ratio of non-metallic elements (1-y) is higher than 0.5, the frictional coefficient at the time of sliding can be lowered. Detailed mechanism has not been clearly known, but it is presumed that when the ratio of non-metallic elements is higher than 0.5, the portion of the non-metallic elements higher than 0.5 is constituted by C which do not bond with metallic elements, and this portion of C increases lubricity. Accordingly, in order to further lower the frictional coefficient at the time of sliding, the ratio of non-metallic elements (1-y) is desirably higher than 0.5, more desirably 0.7 or higher, and even more desirably 0.8 or higher. However, since a coating film having a C component which does not bond with metals does not have high heat resistance, the C component needs to be adjusted depending on the operating temperature. Compounds in which the ratio of non-metallic elements is higher than 0.5 such as that described above can be formed by a film forming method which promotes ionization of hydrocarbon gas. Such a film forming method is a method for forming hard coating film by the cathode arc ion plating method in an atmosphere gas containing hydrocarbon gas described later.

The present invention has been accomplished based on such findings. The thus completed hard coating film according to the present invention is a hard coating film comprising of $(Nb_xM_{1-x})_y(B_aC_bN_{1-a-b})_{1-y}$, where equations (1) to (5) shown below are met [first invention]. The hard coating film according to the present invention excels conventional surface coating layers in wear resistance and slidability with a low frictional coefficient. Therefore, it is suitably applied as a hard coating film to dies, jigs, and tools for their improvement in durability Moreover, since the hard coating film according to the present invention has excellent sliding characteristics at a high specific pressure, it can be suitably used as a hard coating film of dies for cold plastic working for their improvement in durability.

$$0.2 \leq x \leq 1.0 \quad \text{Equation (1)}$$

$$0 \leq a \leq 0.3 \quad \text{Equation (2)}$$

$$0 \leq 1-a-b \leq 0.5 \quad \text{Equation (3)}$$

$$0.5 \leq b \leq 1 \quad \text{Equation (4)}$$

$$0.4 \leq 1-y \leq 0.9 \quad \text{Equation (5)}$$

However, in $(Nb_xM_{1-x})_y(B_aC_bN_{1-a-b})_{1-y}$ above, M is at least one species of elements belonging to Groups 4a, 5a, and 6a and Si and Al. In the above Equations (1) to (5), x, 1-x, a, b, and 1-a-b represent respectively the atomic ratio of Nb, M, B, C, and N, and y and 1-y represent respectively the ratio of $(Nb_xM_{1-x})$, and $(B_aC_bN_{1-a-b})$.

When the ratio of 1-y (the ratio of $B_aC_bN_{1-a-b}$, that is, the ratio of non-metallic elements) is higher than 0.5, the frictional coefficient at the time of sliding is lowered, but the stability at a high temperature is lowered. Accordingly, 1-y is preferably around 0.5 (0.4 to 0.5) in case of a high temperature, while 1-y is preferably higher than 0.5 when it is used at a relatively low temperature. The value of 1-y can be selected depending on its use in this manner. A coating film in which 1-y is higher than 0.5 can be formed, for example, by the following method: Such a coating film can be formed by an arc evaporation source provided with a magnetic field application mechanism in which the magnetic field strength on the surface of a target is 100 gauss or higher, and the direction of the lines of magnetic force is approximately perpendicular to the surface of a target, with a partial pressure of hydrocarbon gas being 1.33 Pa or higher.

In the hard coating film according to the present invention, when x is 1, that is, when the metallic elements are only Nb, a coating film having the most excellent sliding characteristics at a low temperature (rough indication of operating temperature: 300° C. or lower) can be obtained [Second invention].

The hard coating film according to the present invention can have a structure in which y varies in the thickness direction of the film [third invention]. For example, the hard coating film can have such a structure that y decreases (that is, 1-y increases) from the substrate side towards the side of the film surface. In this case, the metal components gradually decreases and non-metal components (specifically C) increases from the substrate side towards the side of the film surface, whereby a more preferable structure can be obtained in terms of wear resistance and slidability.

A multilayered structure can be provided by laminating two or more layers of the hard coating films according to the present invention so that y of the adjacent hard coating films are different from each other [fourth invention]. For example, the following structure is possible: the hard coating film according to the present invention in which y is higher (1-y is lower) on the substrate side is formed, while the hard coating film according to the present invention in which y is lower (1-y is higher) on the side of the film surface is formed. In this case, the amount of metal components decreases stepwise, and the amount of non-metal components (specifically C) increases from the substrate side towards the side of the film surface, whereby a more preferable structure can be obtained in terms of wear resistance and slidability.

One of the materials coated with hard coating film according to the present invention is a material coated with hard coating film which is characterized by the hard coating film according to the present invention formed on the surface of the substrate [fifth invention]. This material coated with hard coating film excels in wear resistance and slidability with a low frictional coefficient. Therefore, it is suitable for use as dies, jigs, and tools for their improvement in durability. Moreover, since it has excellent sliding characteristics at a high specific pressure, it can be suitably used as a hard coating film of dies for cold plastic working for their improvement in durability One of the materials coated with hard coating film according to the present invention is a material coated with hard coating film characterized by a coating film layer comprising a nitride of at least one species of elements belonging to Groups 4a, 5a, and 6a and Si and Al formed on the surface of the substrate consisting of ferrous alloy, and the hard coating film according to the present invention formed thereon [sixth invention]. This material coated with hard coating film has a coating film layer (hereinafter also referred to as undercoat film) formed between the ferrous alloy and hard coating film, which improves the adhesion of the hard coating film, and provides better adhesion and durability. Although this undercoat film has an adhesion improving effect on the hard coating film, those undercoating films which comprise CrN and TiAlN are especially effective in improving adhesion, and it is therefore desirable to use such films. In order to improve adhesion, the thickness of the undercoat film is essentially 0.1 µm or more, and preferably 1 µm or more, but it is desirably 10 µm at the most since forming in a thickness of more than 10 µm has little effectiveness in improving adhesion.

The die for cold plastic working according to the present invention is a die for cold plastic working using the material coated with hard coating film according to the present invention [seventh invention]. The die for cold plastic working according to the present invention excels in wear resistance and slidability with a low frictional coefficient, and has excellent sliding characteristics at a high specific pressure, leading to high durability.

The method for forming hard coating film according to the present invention is a method for forming hard coating film by which the hard coating film according to the present invention is formed using a cathode arc ion plating system in a atmosphere gas containing hydrocarbon gas, and is characterized by setting the partial pressure of hydrocarbon gas in the atmosphere gas to higher than 0.8 Pa but not higher than 4 Pa [eighth invention]. According to this method, the hard coating film according to the present invention can be formed with its surface being smooth.

That is, by forming films using the cathode arc ion plating system as mentioned above (that is, forming films by the cathode arc ion plating method), films can be formed at a high rate utilizing fusion evaporation by arc discharge, even with a high melting point metal such as Nb. By forming films in an atmosphere gas containing hydrocarbon gas such as methane gas, the hydrocarbon gas is ionized and coating films containing carbide can be formed. At this time, by adjusting this atmosphere gas (lowering the amount of nitrogen or setting its amount to zero) and adjusting the evaporation source (preventing B from being contained in the evaporation source), the hard coating film according to the present invention can be formed. At this time, if the partial pressure of hydrocarbon gas in the atmosphere gas is higher than 0.8 Pa, the hard coating film according to the present invention can be formed. If the partial pressure of hydrocarbon gas in the atmosphere gas is 4 Pa or lower, a film with a smooth surface is formed. Therefore, the method for forming hard coating film according to the present invention can form the hard coating film according to the present invention at a high rate with its surface being smooth. The hard coating film formed by the method for forming hard coating film according to the present invention has particularly low frictional coefficient and excellent slidability among the hard coating films according to the present invention.

As can be seen from the above, in forming the hard coating film according to the present invention, film can be formed by the cathode arc ion plating method in the atmosphere gas containing hydrocarbon gas by using the cathode arc ion plating system (partial pressure of hydrocarbon gas: higher than 0.8 Pa but not higher than 4 Pa).

As mentioned above, when the partial pressure of hydrocarbon gas in the atmosphere gas is higher than 0.8 Pa, the hard coating film according to the present invention can be formed. This hard coating film has high hardness, excels in wear resistance, and has excellent slidability with low frictional coefficient. In contrast, when the partial pressure of hydrocarbon gas in the atmosphere gas is 0.8 Pa or lower, the atomic ratio b of C in the coating film formed is lowered. Accordingly, the hardness is lowered and wear resistance is thus lowered, while frictional coefficient is increased and slidability is thus lowered. When the partial pressure of hydrocarbon gas in the atmosphere gas is not higher than 0.8 Pa, a hard coating film having high hardness, excellent wear resistance, low frictional coefficient and excellent slidability cannot be formed. In this respect, in the method for forming hard coating film according to the present invention, the partial pressure of hydrocarbon gas in the atmosphere gas is higher than 0.8 Pa. From the perspective of forming a hard coating film with even better wear resistance, lower frictional coefficient and higher slidability, the partial pressure of hydrocarbon gas in the atmosphere gas is preferably 1 Pa or higher, and more preferably 2 Pa or higher. However, when the partial pressure of hydrocarbon gas in the atmosphere gas is increased, a large amount of particles from the fused target which are characteristic of arc ion plating, called macroparticles, are generated in the film, resulting in lowered smoothness of the surface. When the partial pressure of hydrocarbon gas is higher than 4 Pa, such tendency becomes noticeable, resulting in lowered wear resistance, frictional coefficient and slidability of the hard coating film. In this respect, in the method for forming hard coating film according to the present invention, the upper limit value of the partial pressure of hydrocarbon gas in the atmosphere gas is 4 Pa. In this respect, it is preferable that the partial pressure of hydrocarbon gas is 2 Pa or lower.

In the method for forming hard coating film according to the present invention, the hydrocarbon gas may be any gas that is ionized by the cathode arc ion plating method. Therefore, its type is not especially limited, and various gases can be used. For example, at least one species of methane gas, acetylene gas and toluene gas can be used [ninth invention].

There are two types of atmosphere gases containing hydrocarbon gas: those which contain hydrocarbon gas only; and those which are mixtures of hydrocarbon gas and other gases (inert gases, etc.). Both types can be used as long as their partial pressure of hydrocarbon gas is higher than 0.8 Pa but not higher than 4 Pa.

In the method for forming hard coating film according to the present invention, when the hard coating film where x (atomic ratio of Nb)=1, that is, the coating film mainly comprising Nb carbide is formed, Nb can be used as the target (evaporation source). Since the cathode arc ion plating system is used in the method for forming hard coating film according to the present invention, films can be formed at a high rate utilizing fusion evaporation by arc discharge even with a high melting point metal such as Nb.

EXAMPLES

Examples and Comparative Examples of the present invention will be described below. It should be noted that the present invention is not limited to these Examples, and can be carried out with suitable modifications as long as they conform to the purport of the present invention, which are all included in the technical scope of the present invention.

Example 1

By a film-forming apparatus having an arc evaporation source containing Nb and a metallic element M or further B, coating films having the compositions shown in Table 1 were formed on substrates. However, when forming coating films for use in sliding tests at a high temperature, in order to improve adhesion, CrN was formed on the substrates in a thickness of about 3 µm, and then coating films having the compositions shown in Table 1 were formed.

The substrate is either a cemented carbide plate (with mirror finish) or an SKD11 plate (with a hardness of HRC60). The former is used to form thereon a coating film to be examined for composition and hardness. The latter is used to form thereon a coating film for sliding tests at high temperatures. They are formed in the same way as follows. The substrate plate is placed in the chamber of the film-forming apparatus. The chamber is evacuated (to lower than $1 \times 10^{-3}$ Pa), and the substrate is heated to about 400° C. The hot substrate undergoes sputter cleaning with Ar ions. This step is followed by deposition from an arc vapor source under the following conditions. Target: 100 mm in diameter, Arc current: 150 A, Atmosphere: methane or a mixture of methane (partial pressure: 1.3 Pa) and nitrogen at a total pressure of 1.3 Pa.

The samples thus prepared are examined for film composition, film hardness, and surface roughness (Ra). They are also tested for wear resistance and frictional coefficient in sliding tests at high temperatures.

The film composition is determined measuring with EPMA. The film hardness is measured with a microvickers hardness meter with a load of 0.25 N and a measurement time of 15 seconds. The surface roughness (Ra) is measured with a surface roughness meter. The sliding tests at high temperatures are conducted under the following conditions.

[High-Temperature Sliding Test Conditions]

Apparatus: slide tester of vane-on-disk type

Vane: SKD 61 steel (HRC 50), 3.5×5 mm, 20 mm long, tip radius of 10R

Disk: SKD 11 steel (HRC 60), with coating film

Sliding speed: 0.2 m/sec

Load: 500 N

Sliding distance: 500 m

Testing temperature: 25° C. (without heating), 400° C.

The results of the tests are shown in Table 1. The values on the column of film forming composition in Table 1 are expressed in terms of atomic ratio. Although the ratios of non-metallic elements (1-y) in Nos. 4 to 22 in Table 1 are not shown in Table 1, they are all 0.5. It is apparent from Table 1 that good slidability with a low frictional coefficient and good wear resistance with shallow wear are better achieved in Samples Nos. 4 to 8, 10 to 17 and 19 to 21 than in Comparative Samples Nos. 1 to 3, 9, 18 and 22.

TABLE 1

| No. | Nb | Species of M | Amount of M | B | C | N | Film Thickness nm | Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|
| 1 | | | Tin | | | | 5000 | 22 | 0.55 | 0.55 | 3.00 | >5 μm (film worn out) |
| 2 | | | Tic (CVD process) | | | | 5000 | 30 | 0.54 | 0.4 | 3.00 | >5 μm (film worn out) |
| 3 | | | VC (diffusion process) | | | | 5000 | 32 | 0.5 | 0.4 | 3.00 | >5 μm (film worn out) |
| 4 | 1 | — | 0 | 0 | 1 | 0.00 | 5000 | 37 | 0.5 | 0.2 | 0.50 | 3.00 |
| 5 | 0.8 | V | 0.2 | 0 | 1 | 0.00 | 5000 | 38 | 0.4 | 0.15 | 0.7 | 3.00 |
| 6 | 0.7 | V | 0.3 | 0 | 1 | 0.00 | 5000 | 36 | 0.35 | 0.1 | 1 | 3.00 |
| 7 | 0.5 | V | 0.5 | 0 | 1 | 0.00 | 5000 | 35 | 0.3 | 0.15 | 2 | 3.50 |
| 8 | 0.2 | V | 0.8 | 0 | 1 | 0.00 | 5000 | 33 | 0.3 | 0.2 | 2.5 | 4.00 |
| 9 | 0.1 | V | 0.9 | 0 | 1 | 0.00 | 5000 | 30 | 0.25 | 0.3 | 3.5 | >5 μm (film worn out) |
| 10 | 0.5 | Ti | 0.5 | 0 | 1 | 0.00 | 5000 | 37 | 0.55 | 0.3 | 1.5 | 1.00 |
| 11 | 0.5 | W | 0.5 | 0 | 1 | 0.00 | 5000 | 38 | 0.5 | 0.25 | 2 | 2.00 |
| 12 | 0.5 | Mo | 0.5 | 0 | 1 | 0.00 | 5000 | 38 | 0.55 | 0.25 | 1.55 | 2.00 |
| 13 | 0.5 | Al | 0.5 | 0 | 1 | 0.00 | 5000 | 33 | 0.5 | 0.3 | 1.5 | 2.00 |
| 14 | 0.5 | Si | 0.5 | 0 | 1 | 0.00 | 5000 | 34 | 0.5 | 0.3 | 2 | 1.50 |
| 15 | 0.5 | Ti, V | 0.5 | 0 | 1 | 0.00 | 5000 | 39 | 0.45 | 0.25 | 1 | 1.50 |
| 16 | 0.5 | V | 0.5 | 0.1 | 0.9 | 0.00 | 5000 | 35 | 0.25 | 0.1 | 1.5 | 1.50 |
| 17 | 0.5 | V | 0.5 | 0.3 | 0.7 | 0.00 | 5000 | 36 | 0.2 | 0.1 | 1.5 | 2.00 |
| 18 | 0.5 | V | 0.5 | 0.4 | 0.6 | 0.00 | 5000 | 30 | 0.3 | 0.3 | 3.5 | 5.00 |
| 19 | 0.5 | V | 0.5 | 0 | 0.9 | 0.10 | 5000 | 36 | 0.3 | 0.15 | 1.5 | 2.00 |
| 20 | 0.5 | V | 0.5 | 0 | 0.70 | 0.30 | 5000 | 37 | 0.3 | 0.2 | 2 | 2.50 |
| 21 | 0.5 | V | 0.5 | 0 | 0.50 | 0.50 | 5000 | 38 | 0.35 | 0.25 | 2.5 | 3.00 |
| 22 | 0.5 | V | 0.5 | 0 | 0.30 | 0.70 | 5000 | 33 | 0.5 | 0.4 | 4 | >5 |

Example 2

A substrate is coated by vapor deposition with a film having the composition shown in Table 2. Vapor deposition is carried out in a film-forming apparatus provided with an arc evaporation source containing Nb and M (metallic element) and optional B. For the coating film to be tested for slidability, the substrate is previously coated with an underlying layer of CrN (about 3 μm thick) for good adhesion of the top hard coating film. Finally, the top coating having the composition shown in Table 2 is formed.

The substrate is either a cemented carbide plate (with mirror finish) or an SKD11 plate (with a hardness of HRC60). The former is used to form thereon a coating film to be examined for composition and hardness. The latter is used to form thereon a coating film for sliding test at high temperatures. They are formed in the same way as follows. The substrate plate is placed in the chamber of the film-forming apparatus. The chamber is evacuated (not higher than $1 \times 10^{-3}$ Pa), and the substrate is heated to about 400° C. The hot substrate undergoes sputter cleaning with Ar ions. This step is followed by deposition from an arc vapor source under the following conditions. Target: 100 mm in diameter, arc current: 150 A, and atmosphere: atmosphere gas containing methane gas. The partial pressure of this methane gas is changed variously.

The samples thus prepared are examined for film composition, film hardness, and surface roughness (Ra) in the same way as in Example 1. They are also tested for wear resistance and frictional coefficient in sliding tests at high temperatures.

The results of the tests are shown in Table 2. The values on the column of film forming composition in Table 2 are expressed in terms of atomic ratio. 1-y represents the ratio (proportion) of non-metallic elements. It is apparent from Table 2 that good slidability with a low frictional coefficient and good wear resistance with shallow wear are better achieved in Samples Nos. 6 to 9 and 12 to 16 than in Comparative Samples Nos. 1 to 3, 4 to 5, 10 and 11.

TABLE 2

| No. | Nb | Species of M | Amount of M | B | C | N | 1-y | Film Thickness nm | Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|---|
| 1 | | | Tin | | | | | 5000 | 22 | 0.55 | 0.55 | 3.00 | >5 μm (film worn out) |
| 2 | | | Tic (CVD process) | | | | | 5000 | 30 | 0.54 | 0.4 | 3.00 | >5 μm (film worn out) |
| 3 | | | VC (diffusion process) | | | | | 5000 | 32 | 0.5 | 0.4 | 3.00 | >5 μm (film worn out) |
| 4 | 1 | — | 0 | 0 | 0 | 0.00 | 0.00 | 5000 | 10 | 0.6 | 0.5 | 4.00 | >5 μm (film worn out) |
| 5 | 1 | — | 0 | 0 | 1 | 0.00 | 0.20 | 5000 | 15 | 0.5 | 0.3 | 2.5 | 4.00 |
| 6 | 1 | — | 0 | 0 | 1 | 0.00 | 0.40 | 5000 | 33 | 0.5 | 0.2 | 1 | 3.50 |
| 7 | 1 | — | 0 | 0 | 1 | 0.00 | 0.60 | 5000 | 38 | 0.4 | 0.2 | 0.5 | 3.00 |
| 8 | 1 | — | 0 | 0 | 1 | 0.00 | 0.70 | 5000 | 35 | 0.3 | 0.15 | 0.4 | 3.50 |
| 9 | 1 | — | 0 | 0 | 1 | 0.00 | 0.90 | 5000 | 30 | 0.15 | 0.15 | 0.35 | 4.00 |
| 10 | 0 | — | 0 | 0 | 1 | 0.00 | 1.00 | 5000 | 22 | 0.1 | 0.1 | 2.5 | >5 μm (film worn out) |
| 11 | 0.5 | Ti | 0.5 | 0 | 0 | 0.00 | 0.00 | 5000 | 12 | 0.6 | 0.4 | 3.50 | >5 μm (film worn out) |

TABLE 2-continued

| | | Film composition (:amount of components) (atomic ratio) | | | | | Film Thickness nm | Film Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|
| No. | Nb | Species of M | Amount of M | B | C | N | 1-y | | | | | | |
| 12 | 0.5 | Ti | 0.5 | 0 | 1 | 0.00 | 0.20 | 5000 | 17 | 0.4 | 0.25 | 2 | 3.50 |
| 13 | 0.5 | Ti | 0.5 | 0 | 1 | 0.00 | 0.40 | 5000 | 35 | 0.4 | 0.15 | 1 | 3.50 |
| 14 | 0.5 | Ti | 0.5 | 0 | 1 | 0.00 | 0.60 | 5000 | 40 | 0.3 | 0.15 | 0.5 | 2.50 |
| 15 | 0.5 | Ti | 0.5 | 0 | 1 | 0.00 | 0.70 | 5000 | 37 | 0.2 | 0.1 | 0.4 | 3.50 |
| 16 | 0.5 | Ti | 0.5 | 0 | 1 | 0.00 | 0.90 | 5000 | 30 | 0.1 | 0.1 | 0.4 | 4.50 |

Example 3

A substrate is coated by vapor deposition with a film of multilayered structure or gradient structure. Vapor deposition is carried out in a film-forming apparatus provided with an arc evaporation source containing Nb. For the coating film to be tested for slidability, the substrate is previously coated with an underlying layer of CrN (about 3 μm thick). Finally, the top coating having the composition shown in Table 3 is formed.

The substrate is either a cemented carbide plate (with mirror finish) or an SKD11 plate (with a hardness of HRC60). The former is used to form thereon a coating film to be examined for composition and hardness. The latter is used to form thereon a coating film for sliding test at high temperatures. They are formed in the same way as follows. The substrate plate is placed in the chamber of the film-forming apparatus. The chamber is evacuated (not higher than $1\times10^{-3}$ Pa), and the substrate is heated to about 400° C. The hot substrate undergoes sputter cleaning with Ar ions. This step is followed by deposition from an arc vapor source under the following conditions. Target: 100 mm in diameter, arc current: 150 A, and atmosphere: Atmosphere gas containing methane gas. The partial pressure of this methane gas is changed variously.

The samples thus prepared are examined for film composition, film hardness, and surface roughness (Ra) in the same way as in Example 1. They are also tested for wear resistance and frictional coefficient in sliding tests at high temperatures.

The results of the tests are shown in Table 3. The multilayered film in Table 3 is composed of layer A and layer B, in which layer A is formed, and layer B is then formed thereon. The gradient film is a film having a gradient structure, in which y continuously varies in the thickness direction of the film (from the substrate side towards the film surface side). The composition of layer A and layer B is expressed in terms of atomic ratio. For example, Nb0.2C0.8 implies that Nb and C respectively have an atomic ratio of 0.2 and 0.8 The gradient film No. 2 has the composition of Nb: 0.5 and C: 0.5 in a position which is nearest to the substrate, while the composition is Nb: 0.2 and C: 0.8 in a position which is nearest to the outermost surface of the film. The composition Nb: 0.2 and C: 0.8 can be also referred to as, in $Nb_yC_{1-y}$, y is 0.2 and 1-y is 0.8. The composition Nb: 0.5 and C: 0.5 can be also referred to as, in $Nb_yC_{1-y}$, y is 0.5 and 1-y is 0.5.

TABLE 3

| | Layer A | | | Layer B | | | | Total film thickness nm | Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|---|
| No. | Composition | Layer thickness nm | Number of layers | Composition | Layer thickness nm | Number of layers | Type | | | | | | |
| 1 | Nbc | | | | | | Single layer | 5000 | 37 | 0.5 | 0.2 | 0.50 | 3.00 |
| 2 | Nb0.5C0.5 | | | Nb0.2C0.8 | | | Gradient film | 5000 | 35 | 0.2 | 0.2 | 0.25 | 3.50 |
| 3 | Nb0.5C0.5 | 2500 | 1 | Nb0.2C0.8 | 2500 | 1 | Multilayered film | 5000 | 32 | 0.2 | 0.2 | 0.30 | 3.00 |
| 4 | Nb0.5C0.5 | 1000 | 2 | Nb0.2C0.8 | 1000 | 2 | Multilayered film | 5000 | 34 | 0.25 | 0.2 | 0.30 | 2.50 |
| 5 | Nb0.5C0.5 | 500 | 5 | Nb0.2C0.8 | 500 | 5 | Multilayered film | 5000 | 36 | 0.3 | 0.2 | 0.4 | 2.00 |
| 6 | Nb0.5C0.5 | 20 | 125 | Nb0.2C0.8 | 20 | 125 | Multilayered film | 5000 | 37 | 0.3 | 0.2 | 0.4 | 2.00 |
| 7 | Nb0.5C0.5 | 5 | 500 | Nb0.2C0.8 | 5 | 500 | Multilayered film | 5000 | 34 | 0.3 | 0.2 | 0.5 | 3.00 |

It is apparent from Table 3 that good slidability with a low frictional coefficient and good wear resistance with shallow wear are better achieved by the hard coating films which meet the requirements of Fourth and Third inventions (Samples Nos. 3 to 7 and No. 2, respectively) than in Comparative Samples (Nos. 1 to 3 in Table 1) in Example 1 above. It is also apparent that good slidability with a low frictional coefficient and good wear resistance with shallow wear are better achieved than in No. 1 single-layer film (NbC) in Table 3.

Example 4

A substrate is coated by vapor deposition with a film comprising of $Nb_yC_{1-y}$. Vapor deposition is carried out in a film-forming apparatus provided with an arc evaporation source containing Nb. For the coating film to be tested for slidability, the substrate is previously coated with an underlying layer of CrN (about 3 μm thick) for good adhesion of the top hard coating film. Finally, the top coating having the composition shown above is formed.

The substrate is either a cemented carbide plate (with mirror finish) or an SKD11 plate (with a hardness of HRC60). The former is used to form thereon a coating film to be examined for composition and hardness. The latter is used to form thereon a coating film for sliding test at high temperatures. They are formed in the same way as follows. The substrate plate is placed in the chamber of the film-forming apparatus. The chamber is evacuated (not higher than $1 \times 10^{-3}$ Pa), and the substrate is heated to about 400° C. The hot substrate undergoes sputter cleaning with Ar ions. This step is followed by deposition from an arc vapor source under the following conditions. Target: 100 mm in diameter, arc current: 150 A, and atmosphere: atmosphere gas containing methane gas. The partial pressure of this methane gas is changed variously, whereby the ratio of C in $Nb_yC_{1-y}$ (1-y) is varied.

The samples thus prepared are examined for film composition, film hardness, and surface roughness (Ra) in the same way as in Example 1. They are also tested for wear resistance and frictional coefficient in sliding tests at high temperatures.

The results of the tests are shown in Table 4. It is apparent from Table 4 that good slidability with a low frictional coefficient and good wear resistance with shallow wear are better achieved by the hard coating films when the partial pressure of methane gas in the atmosphere gas during film forming is higher than 0.8 Pa but not higher than 4 Pa, that is, when the requirements of the method of forming hard coating film according to the present invention are met (Nos. 4 to 7), than when the partial pressure of methane gas is 0.8 Pa or lower or higher than 4 Pa (Nos. 1 to 3 and 8).

wear resistance, slidability (with low frictional coefficient) at a high speed, with its surface being smooth.

The present invention has been described above in detail with reference to specific embodiments, but it is apparent for those skilled in the art that various changes and modifications can be made without deviating from the spirit and scope of the present invention. The present application is based on Japanese Patent Application (No. 2007-202192) applied on Aug. 2, 2007 and Japanese Patent Application (No. 2008-144723) applied on Jun. 2, 2008, and their contents are hereby incorporated by reference.

The invention claimed is:

1. A die for cold plastic working comprising a material comprising a substrate and a hard coating film formed on a surface of the substrate and formed by a cathode arc ion plating method, wherein the hard coating film comprises $(Nb_xM_{1-x})_y(B_aC_bN_{1-a-b})_{1-y}$, wherein $0.2 \leq x < 1.0$              Equation (1)

$0 \leq a \leq 0.3$              Equation (2)

$0 \leq 1-a-b \leq 0.5$              Equation (3)

$0.5 \leq b \leq 1$              Equation (4)

$0.4 \leq 1-y \leq 0.9$              Equation (5)

wherein, M denotes V only, or V and at least one species of elements belonging to Groups 4a, 5a, which are different from V, and 6a and Si and Al; x, 1-x, a, b, and 1-a-b represent respectively the atomic ratio of Nb, M, B, C and N; y and 1-y represent respectively the ratio of $(Nb_xM_{1-x})$ and $(B_aC_bN_{1-a-b})$: when M comprises Al, then $0.5 \leq x < 1.0$, wherein $0.1 \leq a \leq 0.3$.

2. A die for cold plastic working comprising a material comprising a substrate and a hard coating film formed on a surface of the substrate and formed by a cathode arc ion

TABLE 4

| No. | Partial pressure of methane gas Pa | Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|
| 1 | 0 | 15 | 0.8 | 0.5 | 3.00 | >5 |
| 2 | 0.5 | 20 | 0.8 | 0.5 | 3.00 | >5 |
| 3 | 0.8 | 24 | 0.7 | 0.4 | 2.5 | >5 |
| 4 | 1 | 34 | 0.4 | 0.2 | 0.50 | 4.00 |
| 5 | 1.3 | 37 | 0.3 | 0.2 | 0.50 | 3.00 |
| 6 | 2 | 33 | 0.4 | 0.25 | 1 | 3.00 |
| 7 | 4 | 32 | 0.55 | 0.25 | 1.5 | 3.50 |
| 8 | 7 | 25 | 0.7 | 0.5 | 3 | >5 |

INDUSTRIAL APPLICABILITY

The hard coating film according to the present invention excels in conventional surface coating layer in wear resistance and slidability with a low frictional coefficient, and it will be applied to dies, jigs, and tools for their improvement in durability. The method for forming hard coating film according to the present invention is useful since it can form hard coating film, among the hard coating films according to the present invention, having an especially high ratio of non-metallic elements (B, C, N) (1-y) and atomic ratio (b) of C among the non-metallic elements (B, C, N), particularly good plating method, wherein the hard coating film comprises $(Nb_xM_{1-x})_y(B_aC_bN_{1-a-b})_{1-y}$, wherein $0.2 \leq x < 1.0$              Equation (1)

$0 \leq a \leq 0.3$              Equation (2)

$0 \leq 1-a-b \leq 0.5$              Equation (3)

$0.5 \leq b \leq 1$              Equation (4)

$0.4 \leq 1-y \leq 0.9$              Equation (5)

wherein, M denotes V only, or V and at least one species of elements belonging to Groups 4a, 5a, which are different from V, and 6a and Si and Al; x, 1-x, a, b, and 1-a-b represent respectively the atomic ratio of Nb, M, B, C and N; y and 1-y represent respectively the ratio of $(Nb_xM_{1-x})$ and $(B_aC_bN_{1-a-b})$; when M comprises Al, then $0.5 \leq x < 1.0$, wherein $0.2 \leq x \leq 0.8$ and wherein $0.1 \leq a \leq 0.3$.

* * * * *